United States Patent [19]

Hauser et al.

[11] Patent Number: 4,972,072
[45] Date of Patent: Nov. 20, 1990

[54] SYSTEM FOR DETECTING A FILM LAYER ON AN OBJECT

[75] Inventors: Hugo Hauser, Palo Alto; Kevin M. Monahan, Mountain View, both of Calif.

[73] Assignee: Tritec Industries, Inc., Mountain View, Calif.

[21] Appl. No.: 467,314

[22] Filed: Jan. 17, 1990

Related U.S. Application Data

[63] Continuation of Ser. No. 252,788, Oct. 3, 1988, abandoned.

[51] Int. Cl.$^5$ .................. G01B 11/02; G01B 11/06; G02F 1/01
[52] U.S. Cl. .................. 250/225; 356/357; 356/382; 250/226
[58] Field of Search .................. 250/225, 560, 226; 356/369, 367, 355, 357, 381, 382, 626; 430/329

[56] References Cited

U.S. PATENT DOCUMENTS

| | | | |
|---|---|---|---|
| 4,198,261 | 4/1980 | Busta et al. | 356/382 |
| 4,293,224 | 10/1981 | Gaston et al. | 356/357 |
| 4,367,044 | 1/1983 | Booth, Jr. et al. | 356/382 |
| 4,377,343 | 3/1983 | Monson | 356/357 |
| 4,454,001 | 6/1984 | Sternheim et al. | 356/382 |
| 4,462,860 | 7/1984 | Szmanda | 356/381 |
| 4,585,348 | 4/1986 | Chastang et al. | 356/369 |
| 4,611,919 | 9/1986 | Brooks, Jr. et al. | 356/357 |
| 4,618,262 | 10/1986 | Maydan et al. | 356/357 |
| 4,660,979 | 4/1987 | Muething | 356/357 |
| 4,676,644 | 6/1987 | Canteloup | 356/357 |
| 4,680,084 | 7/1987 | Heimann et al. | 356/382 |
| 4,838,694 | 6/1989 | Betz et al. | 356/357 |

FOREIGN PATENT DOCUMENTS 0149846  7/1986  Japan .................. 356/369

Primary Examiner—David C. Nelms
Assistant Examiner—Michael Messinger
Attorney, Agent, or Firm—Thomas E. Schatzel

[57] ABSTRACT

Circularly polarized light is used to detect an end point of a thin film layer. Collimated light is passed through a polarizing filter and a polarizing beam splitter resulting in light which is almost entirely linearly polarized in a first direction. This first direction polarized light is passed through a quarter wave retarder and is converted to circularly polarized light. The circularly polarized light is reflected off of a surface having a thin film layer and passes back through the quarter wave retarder. This reflected circularly polarized light is converted by the quarterwave retarder into linearly polarized light having a second direction. This second direction polarized light is easily isolated by passing it back through the beam splitter. The light may then be analyzed by end-point detection circuitry and the endpoint of the film layer detected.

6 Claims, 2 Drawing Sheets

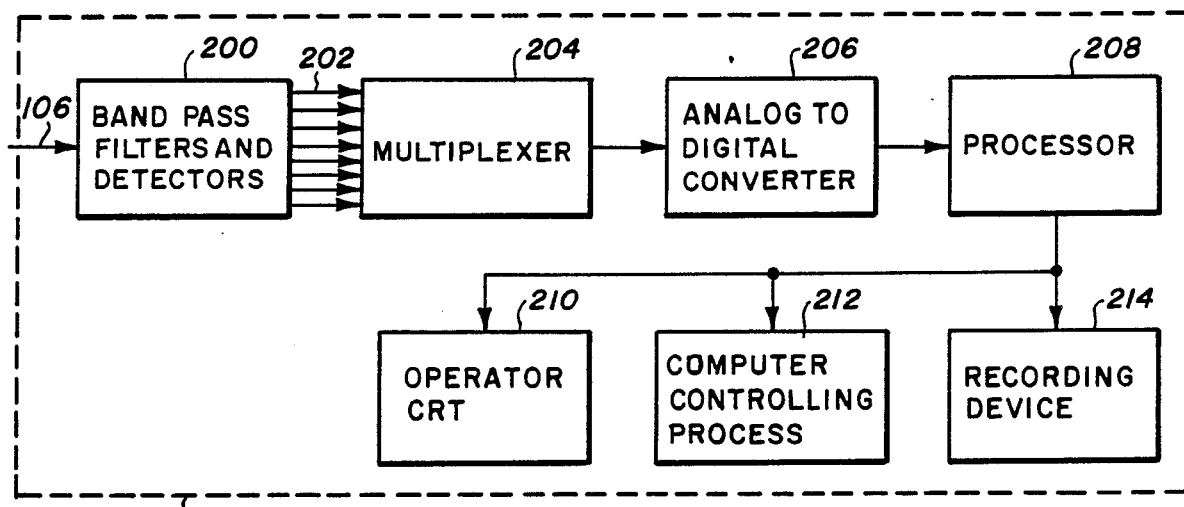
Fig_2
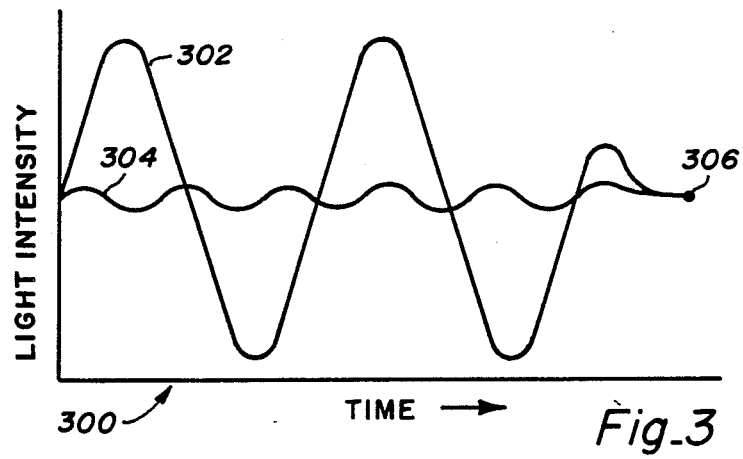
Fig_3
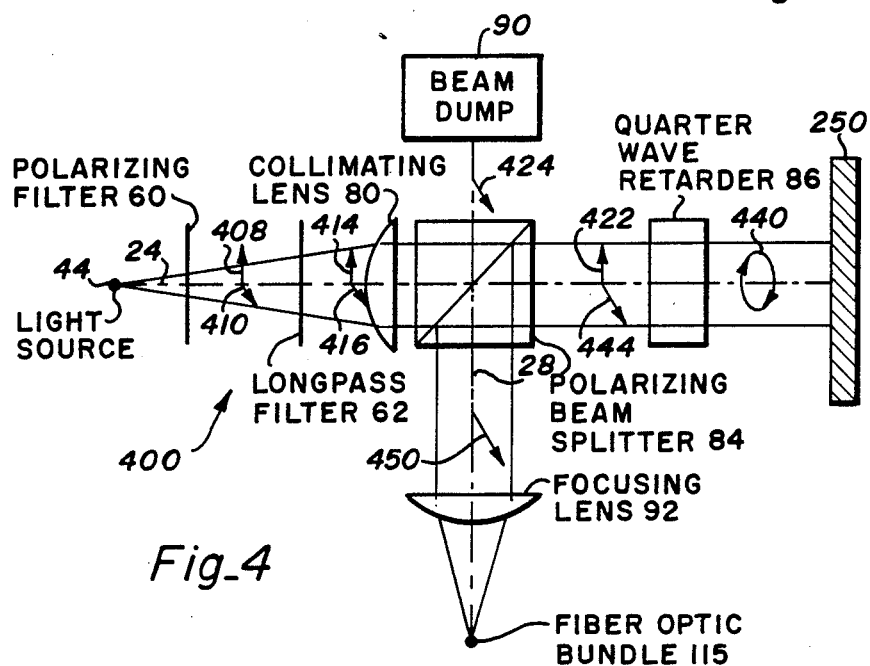
Fig_4

SYSTEM FOR DETECTING A FILM LAYER ON AN OBJECT

This is a continuation of application Ser. No. 252,788 filed on Oct. 3, 1988, now abandoned.

BACKGROUND OF THE INVENTION

1. Field of the Invention

The invention relates generally to systems for detecting a thin film layer and more particularly to a system for detecting thin film layers using circularly polarized light.

2. Description of the Prior Art

Objects are often treated with thin chemical films during commercial processing. Sometimes these thin films are removed during the course of the process and it becomes necessary to detect when the thin film is no longer present.

For example, in the semiconductor industry, integrated circuits are produced using thin films of chemicals known as photoresist. Circular silicon wafers are covered with photoresist and are spun so that a thin and even layer of photoresist remains. Light of a certain frequency is passed through a mask and exposes the photoresist. The mask has a circuit pattern which allows only certain portions of the photoresist to be exposed to the light. After the photoresist is exposed to the light, the exposed areas are developed or etched away, leaving the underlying substrate exposed for the next process step. These areas of exposed substrate which contain the circuit pattern may be less than one micron in width and may represent less than two percent of the surface area of the wafer. With these small areas, tolerances become extremely high. If the wafer is left exposed to the light too long, then areas of photoresist in addition to the circuit pattern may be developed and the substrate exposed. It is therefore extremely important to know when the photoresist of the circuit pattern has been fully etched away so that the development process can be shutoff immediately.

The point in time during the process when the photoresist has been completely etched away is referred to in the industry as the "end-point". Various end-point detection apparatus and methods are known in the prior art. These include U.S. Pat. No. 4,647,172 (Batchelder et al.); U.S. Pat. No. 4,618,262 (Maydan et al.); U.S. Pat. No. 4,338,157 (Kanda); U.S. Pat. No. 4,377,436 (Donnelly et al.); U.S. Pat. No. 4,312,732 (Degenkolb et al.); U.S. Pat. No. 4,469,424 (Matsui et al.); U.S. Pat. No. 4,621,037 (Kanda et al.); U.S. Pat. No. 4,389,217 (Baughman et al.); U.S. Pat. No. 4,462,860 (Szmanda); and U.S. Pat. No. 4,634,880 (Lindow, et al.).

The most common type of end-point detector involves aiming a beam of light at a wafer and detecting the intensity of the reflected light. As the thin film layer is etched away, its depth changes, and this causes oscillations in the detected intensity level of specularly reflected light. Once the film layer is removed, the light intensity stabilizes.

These prior art systems have a number of problems. As the circuit patterns used today have become increasingly small, so have the exposed film areas of interest. The light reflected from these areas is proportionally smaller and interfering light from ambient light is proportionally larger. The signal-to-noise ratio becomes smaller. In other words, the oscillations caused by the level of the exposed film layer become smaller and harder to detect.

Another problem with prior art systems is that they require precise positioning of the end-point detector relative to the wafer. The circuit pattern consists of channels etched in the photoresist. Depending upon the orientation of the wafer, the intensity and polarization of the reflected light can vary greatly. In addition, some of the prior art requires that the end-point detector focus on a certain portion of the wafer using a lens. This requires that the end-point detector be positioned a precise distance above the wafer so that the focal point of the lens is located on the wafer.

SUMMARY OF THE PRESENT INVENTION

It is therefore an object of the present invention to provide a system for detecting a film layer which is more effective at screening out ambient light.

It is another object of the present invention to provide a system for detecting a film layer which is independent of distance to or orientation of the wafer.

It is another object of the present invention to provide a system that will reject depolarized light due to scattering from resist sidewalls, aerosol droplets, suspended particles and bubbles in the developer solution.

It is another object of the present invention to provide a system that will reject light which is not specularly reflected from the substrate.

Briefly, in a preferred embodiment, the present invention includes a light source having a collimating lens. Light from the collimating lens is passed through a polarizing beam splitter which polarizes the light linearly in a first direction. This polarized light is then passed through a quarter wave retarder and is converted to circularly polarized light. The circularly polarized light is reflected off of a thin film layer and passed back through the quarter wave retarder. The reflected circularly polarized light is thereby converted to light which is polarized linearly in a second direction. This second direction polarized light is passed back through the beam splitter and is diverted to a focusing lens. The focused light is then analyzed by an end-point detection circuit.

The use of circularly polarized light enables the present invention to screen out ambient light which is not circularly polarized and to be independent of wafer orientation. The use of the collimating and focusing lens make the present invention independent of distance from the wafer and further screens out unwanted scattered light.

An advantage of the present invention is that it provides a system for detecting a film layer which more effectively screens out ambient light depolarized light and scattered light.

Another advantage of the present invention is that it provides a system which is independent of distance to or orientation of the wafer.

It is another advantage of the present invention in that it provides a system which will reject the polarized light due to scattering from resist sidewalls, aerosol droplets, suspended particles and bubbles in the developer solution.

It is another advantage of the present invention in that it will provide a system that will reject light that is not specularly reflected from the substrate.

These and other objects and advantages of the present invention will no doubt become obvious to those with ordinary skill in the art after having read the following detailed description of the preferred embodiment which is illustrated in the various drawing figures.

IN THE DRAWINGS

FIG. 2 is a block diagram of the end-point detection circuit of FIG. 1;

FIG. 3 is a graph showing the intensity of light versus time for the light received by the system of FIG. 1; and FIG. 4 is a schematic diagram of the operation of the present invention.

DETAILED DESCRIPTION OF THE PREFERRED EMBODIMENT

Figure 1:
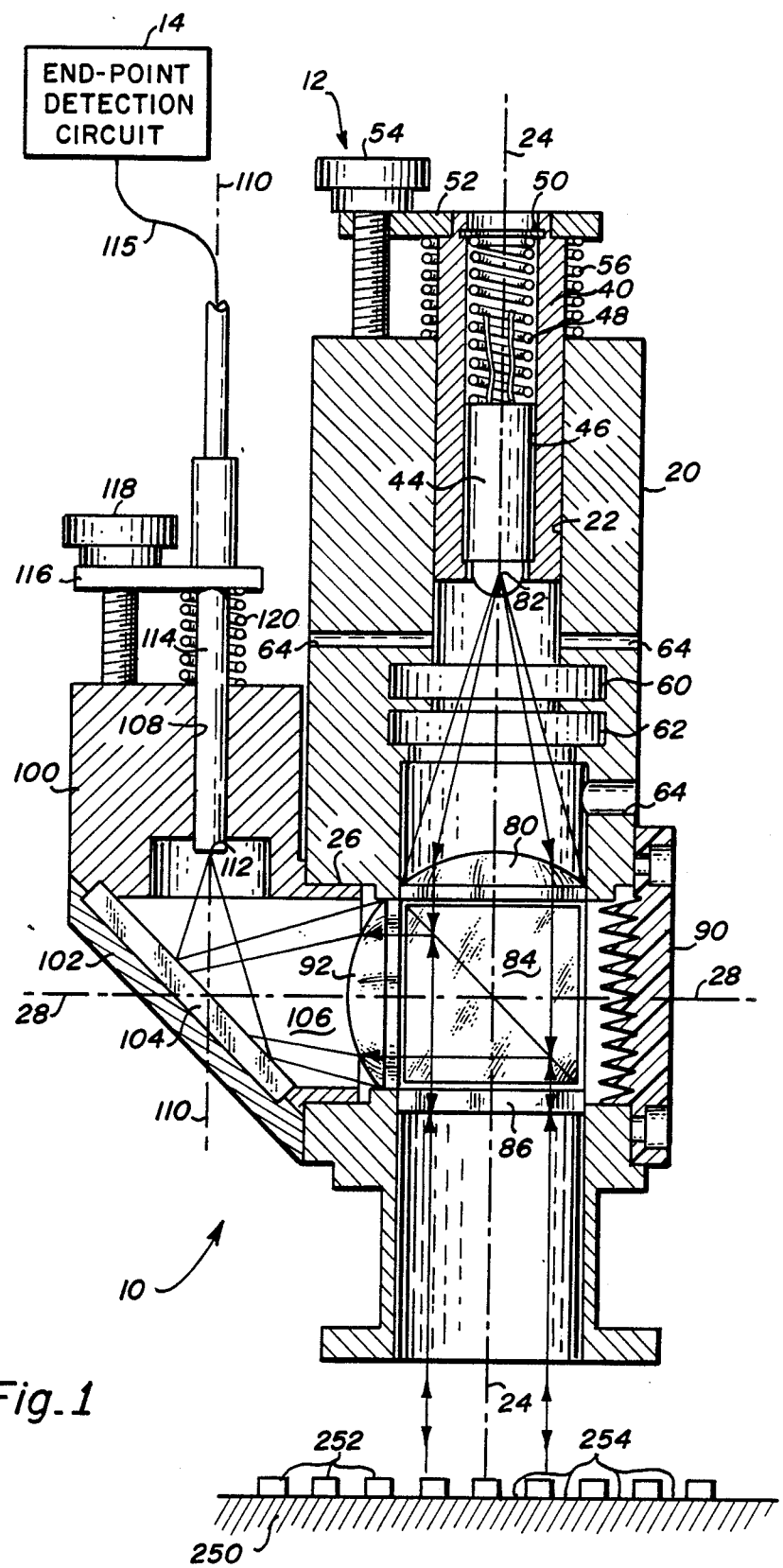
FIG. 1 is a cross-sectional view of a film detection system of the present invention.

FIG. 1 shows a cross-sectional view of a system of the present invention and is designated by the general reference character 10. System 10 includes an optical head 12 and an end-point detection circuit 14. Head 12 comprises a tube shaped housing 20 having a lamp passage 22 along a first axis 24 and a side passage 26 along a second axis 28. Axes 24 and 28 intersect one another at approximately a 90° degree angle.

A lamp housing member 40 is slidably mounted in one end of lamp passage 22. Member 40 is cylindrical in shape and contains a light source 44 mounted within an inner passage 46 of member 40 along axis 24. Light source 44 may be a tungsten halogen lamp, however, other light sources, including lasers, may be used. Light source 44 is held in place within passage 46 by a spring 48 and a stop member 50. A plate 52 is attached to member 40 and receives a screw 54. A spring 56 surrounds member 40 and holds member 40 in place. The height of light source 44 may be adjusted by means of screw 54.

A linear polarizing filter 60 and a long pass filter 62 are mounted in passage 22, along axis 24, and below light source 44. Long pass filter 62 filters out unwanted light having certain wave lengths which may interfere with the process under observation. For example, in the situation where photoresist is used, filter 62 would block all light having wavelengths which would expose the photoresist. For certain applications filter 62 may be omitted. A plurality of heat vents 64 pass through housing 20 and intersect passage 22.

A collimating lens 80 is mounted in passage 22 along axis 24 and below filter 62. Lens 80 has a focal point 82 along axis 24. Member 40 is adjusted up or down until the filament of the light source 44 is at focal point 82. A broadband polarizing beam splitter 84 is mounted within housing 20 where passages 22 and 26 intersect. Beam splitter 84 may be a solid block shape comprised of two triangular roof type prisms having a polarizing coating located between them. A broadband quarter wave retarder 86 is mounted with passage 22 along axis 24 below beam splitter 84.

A beam dump 90 is mounted in passage 26 along axis 28 on a first side of beam splitter 84. Beam dump 90 may be a blade stack arrangement made of black Delrin. A focus lens 92 is mounted in passage 26 along axis 28 on a second side of beam splitter 84.

A detector housing 100 fits within side passage 26. Housing 100 has a mirror section 102 having a mirror 104. Mirror 104 is positioned at an angle of 45° relative to axis 28. The interior of housing 100 forms a mirror chamber 106. A passage 108 is located along a vertical axis 110 above mirror 104. Axis 110 is located such that it intersects the focal point 112 of lens 92. Passage 108 receives a fiber optic bundle coupling 114. Coupling 114 contains a fiber optic bundle 115. Coupling 114 is attached to a plate member 116 which receives a screw 118. A spring 120 surrounds coupling 114 and holds it in position. Coupling 114 is slidably adjusted along axis 110 by means of screw 118 until the end of bundle 115 is located at focal point 112. Bundle 115 is connected to the end point detection circuit 14.

FIG. 2 shows a block diagram of the end-point detection circuit 14. A plurality of band pass filters and detectors 200 are connected to bundle 115. Filters and detectors 200 isolate the light received according to wavelength and output the resulting electrical signal along a plurality of lines 202 to a multiplexer 204. Multiplexer 204 is connected to an analog to digital converter 206 which in turn is connected to a processor 208. The output of processor 208 may be sent to an operator CRT 210, a computer which is controlling the film process 212, and/or a recording device 214.

Returning now to FIG. 1, in operation, optical head 12 is positioned above a wafer 250, such that axis 24 is approximately perpendicular to the planar surface of wafer 250. Wafer 250 has been processed with a thin film coating of photoresist 252 and is illustrated as of the moment when the photoresist in the exposed areas 254 has been fully developed and removed. This is also known as the end-point of the development process and the areas 254 of the underlying wafer 250 are no longer covered by photoresist and are fully revealed.

Light from light source 44 passes through polarizing filter 60 where it is polarized linearly in a first direction. The first direction polarized light then passes through filter 62 where light of unwanted wavelengths (those that would expose photoresist, as an example) are screened out. The first direction polarized light then passes through collimating lens 80 where all the light rays are collimated in a direction parallel to axis 24.

Next, the collimated first direction polarized light enters the polarizing beam splitter 84. Here, any light which is polarized in a second direction and was not screened out by filter 60 is reflected at a right angle along axis 28 into beam dump 90. The light entering beam dump 90 is almost completely absorbed and very little reflected light escapes. The first direction polarized light is allowed to pass through beam splitter 84 parallel to axis 24. This light then enters quarter wave retarder 86 where it is converted to circularly polarized light.

The circularly polarized light exits head 12 parallel with axis 24. The light hits wafer 250 at an angle of approximately 90° degrees and is reflected back parallel to axis 24. The reflected circularly polarized light enters quarter wave retarder 86 and is converted to light which is polarized linearly in a second direction. This second direction polarized light is reflected by beam splitter 84 at a 90° degree angle along axis 28 into focusing lens 92. This light is then focused into point 112 via mirror 104 where it enters fiber bundle 115 which transmits it to circuit 14. Mirror 104 is used here to redirect the light in order to shorten the overall length of optical head 12. Mirror 104 may be omitted by repositioning bundle 115 along axis 28.

As shown in FIG. 2, the light enters band pass filters and detectors 200 where it is separated into a plurality of different wavelengths and converted to electrical signals. These different wavelengths are beneficial because, depending upon the type of surface and film layer, some wavelengths of light provide a better signal for detecting an end-point.

FIG. 3 shows a graph of light intensity versus time for light received by circuit 14 and is designated by the general reference character 300. Graph 300 illustrates the signals for light at two different wavelengths. For example, line 302 may represent light with 900 nm wavelength and line 304 may represent light with 650 nm wavelength. Graph 300 shows that as the thin film layer develops and its depth decreases, the intensity of the reflective light oscillates. Once the film is completely gone the oscillation stops at an end point 306. However, the signal line 302 has a greater amplitude in its oscillations than signal line 304. This makes it easier to detect the end-point 306. For a different surface and film layer material, a different wavelength of light may have oscillations of greater amplitude. By using a plurality of wavelengths, the present invention can be used with a variety of different materials.

Referring to FIG. 2, the electrical signals from lines 202 are multiplexed by multiplexer 204 and converted to digital signals at converter 206. Processor 208 analyzes the digital signals of a particular wavelength of light. The processor takes the derivative of the signal and when this equals approximately zero (slope of line 302 approximately equal to zero) for a predetermined length of time, then the end-point 306 has been detected. Processor 208 then outputs an end-point signal to CRT 210, computer 212, and recording device 214. Computer 212 then shuts off the developing process to stop the photoresist development.

FIG. 4 shows a schematic, referred to by the general reference character 400, which illustrates the operation of the optical head 12 of FIG. 1. The light source 44 produces unpolarized light along the axis 24 which is passed through the polarizing filter 60. The remaining light is almost entirely polarized linearly in a first direction. This first direction of polarization is represented by a vector arrow 408. Arrow 408 is perpendicular to axis 24. A small component of second direction polarized light may not have been screened out by filter 60. This is represented by vector arrow 410 which is perpendicular to both axis 24 and arrow 408.

The light then passes through the long pass filter 62 where light of a certain wavelength is filtered out. The remaining light still has polarization vectors which are represented by arrows 414 and 416. The light then enters collimating lens 80 and then polarizing beam splitter 84. Here, light polarized in the first direction is allowed to pass and is represented by a vector arrow 422. Any remaining light polarized in the second direction (represented by a vector arrow 424) is directed into the beam dump 90 along an axis 28. The light polarized in the first direction passes through a quarter wave retarder 86 and is converted to circularly polarized light which is represented by a vector arrow 440.

This circularly polarized light is reflected off the surface of wafer 250 which contains the film layers 252 (not shown). The reflective circularly polarized light returns to plate 86. However, now the circularly polarized light is converted to light which is polarized linearly in the second direction and is represented by a vector arrow 444. This second direction polarized light is diverted along axis 28 at beam splitter 84 and is represented by a vector arrow 450. This light is focused by lens 92 into the entrance to the fiber optic bundle 106.

The advantages of the present invention may now be understood. Circularly polarized light is used to reflect off of the sample. This type of light is unique and in essence this light is tagged for identification so that upon its return it is easily separated from the interfering ambient light. The circularly polarized light has the additional advantage that it is not affected by the orientation of the film pattern on the surface of the sample. This is not true of linearly polarized light.

Another advantage of the present invention is that it rejects off-axis ambient or scattered light. The light sent and received by the device is all along the same axis which is approximately perpendicular to the surface of the sample. The focusing lens 92 rejects off-axis light.

It should also be noted that the present invention does not use a lens to focus light upon the sample itself as in some of the prior art. This prior art lens method requires that the device be located a certain distance above the sample so that the focus point of the lens falls upon the sample. Instead, the present invention uses parallel light from collimating lens 80 and the device is independent of distance from the sample.

Thus, the present invention can be considered a polarizing (uses circularly polarized light), telecentric (is independent of distance from the sample), optical head.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A system for detecting a film layer comprising:
a circularly polarizing means for producing circularly polarized light and reflecting said circularly polarized light off of a first and second surface of said film layer;
filter means in optical communication with said surface, for receiving and isolating said circularly polarized light and producing a linear polarized light;
detection means in optical communication with the filter means, for receiving said linear polarized light, said detection means having a plurality of frequency bandwidth detectors for isolating a selected bandwidth of said linearly polarized light, an analog-to-digital converter connected to said detectors for providing a digital intensity signal, and a processing means connected to said converter for analyzing said digital intensity signal with respect to time and determining when said film layer is no longer present on said surface.

2. A system for detecting a film layer comprising:
a housing having a first longitudinal chamber located along a first axis and a second longitudinal chamber located along a second axis and intersecting said first chamber;
a light source located at a first end of said first chamber;
a polarizing beam splitter located where said first and second chambers intersect;
a linear polarizing filter located in said first chamber between the light source and the polarizing beam splitter;
a collimating lens located in said first chamber between the lens polarizing filter and the beam splitter and having a focus point located at said light source;

a light aperture located at a second end of said first chamber for allowing light to pass outside the housing;

a detection means located at a first end of said second chamber for analyzing a light source, said detection means comprising a plurality of frequency bandwidth detectors for isolating a selected bandwidth of said light signal, an analog-to-digital converter connected to said detectors for producing a digital intensity signal, a processing means connected to said converter for analyzing said digital intensity signal, and a processing means connected to said converter for analyzing said digital intensity signal with respect to time and determining when said film layer is no longer present on said surface; and a focusing lens located in said second chamber between the beam splitter and the detection means and having a focus point located at an input point of the detection means.

3. The system of claim 2 further including,
a beam dump located in a second end of said second chamber for receiving and absorbing a light beam from the beam splitter, said beam dump comprising a blade stack of Delrin material.

4. The system of claim 2 further including,
a frequency filter located in said first chamber between the light source and the collimating lens.

5. The system of claim 2 further including,
adjustment means connected to the light source for moving said light source relative to said focus point of said collimating lens.

6. The system of claim 3 wherein,
said input point of said detection means comprises a fiber optic coupling; and
the device further comprises adjustment means connected to said fiber optic coupling for moving said fiber optic coupling relative to said focus point of said focusing lens.

* * * * *